(12) United States Patent
Amou et al.

(10) Patent No.: US 6,306,481 B1
(45) Date of Patent: *Oct. 23, 2001

(54) MULTILAYER CIRCUIT BOARD HAVING INSULATING LAYER WITH VIA-HOLES

(75) Inventors: Satoru Amou; Masao Suzuki, both of Hitachi; Tokihito Suwa, Hitachinaka; Mineo Kawamoto, Hitachi; Akio Takahashi, Hitachioota; Masanori Nemoto, Juou-machi; Hiroyuki Fukai, Shimodate; Mitsuo Yokota, Yuuki; Shiro Kobayashi, Isehara; Masashi Miyazaki, Hadano, all of (JP)

(73) Assignees: Hitachi, Ltd.; Hitachi Chemical Company, Ltd., both of Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/337,268

(22) Filed: Jun. 22, 1999

Related U.S. Application Data

(62) Division of application No. 08/896,456, filed on Jul. 18, 1997, now Pat. No. 5,914,216.

(30) Foreign Application Priority Data

Jul. 25, 1998 (JP) ................................................. 8-196662

(51) Int. Cl.[7] ....................................................... B32B 3/10
(52) U.S. Cl. ........................... 428/137; 428/901; 428/209; 428/413; 428/418; 430/280.1; 430/311; 522/25; 522/83; 522/170
(58) Field of Search ................................. 428/901, 137, 428/413, 418, 131, 209; 522/25, 83, 170

(56) References Cited

U.S. PATENT DOCUMENTS

| | | | |
|---|---|---|---|
| 3,993,851 | 11/1976 | Robinson et al. | 428/531 |
| 4,666,951 | 5/1987 | Onishi et al. | 522/170 |

(List continued on next page.)

FOREIGN PATENT DOCUMENTS

| | | |
|---|---|---|
| 222187A | 5/1987 | (EP). |
| 1321263 | 6/1973 | (GB). |
| 2061280A | 5/1981 | (GB). |
| 49-17040 | 4/1974 | (JP). |
| 50-158694 | 12/1975 | (JP). |
| 56-55420 | 5/1981 | (JP). |
| 63-71840 | 4/1988 | (JP). |
| 01-137695 | 5/1989 | (JP). |
| 5-273753 | 10/1993 | (JP). |
| 8-8541 | 1/1996 | (JP). |

OTHER PUBLICATIONS

Patent Abstracts of Japan 08–008541.
Patent Abstracts of Japan 01–137695.

*Primary Examiner*—Blaine Copenheaver
*Assistant Examiner*—Wendy Boss
(74) *Attorney, Agent, or Firm*—Antonelli, Terry, Stout & Kraus, LLP

(57) ABSTRACT

A multilayer circuit board having a resolution in the range of 25–80 $\mu$m, and blind via-holes between layers, the blind via-holes having an aspect ratio in the range of 2.0–0.6 for effecting access between the layers, wherein an insulating layer having the blind via-holes between the layers has a glass transition temperature in the range of 150–220° C., and an epoxy group photosensitive resin composition is used therefor. A photosensitive resin composition having a preferable resolution and heat resistance is obtained. A multilayer circuit board is provided in which the thermal stress generated in the steps of a reflow process, a gold wire bonding process and a repairing process in a bare chip mounting process are reduced, and peeling off of the conductor wiring and deformation of the multilayer circuit board caused by mechanical stresses during the heating processes are suppressed. Accordingly, a decrease in the size and weight of an electronic apparatus is possible.

11 Claims, 1 Drawing Sheet

U.S. PATENT DOCUMENTS

| | | | |
|---|---|---|---|
| 4,994,346 | 2/1991 | Meier et al. | 430/280.1 |
| 5,079,129 | 1/1992 | Meier et al. | 430/280 |
| 5,206,116 | 4/1993 | Daniels et al. | 430/311 |
| 5,312,715 | 5/1994 | Daniels et al. | 430/280 |
| 5,356,698 | 10/1994 | Kawamoto et al. | 428/209 |
| 5,370,971 | 12/1994 | Ogawa et al. | 430/280.1 |
| 5,532,105 | 7/1996 | Yamadera et al. | 430/280.1 |
| 5,627,010 | 5/1997 | Pai et al. | 430/280.1 |
| 5,691,395 | 11/1997 | Knudsen et al. | 430/280.1 |
| 5,965,687 * | 10/1999 | Jensen . | |

* cited by examiner

MULTILAYER CIRCUIT BOARD HAVING INSULATING LAYER WITH VIA-HOLES

This application is a Divisional application of Ser. No. 08/896,456, filed Jul. 18, 1997 now U.S. Pat. No. 5,914,216.

BACKGROUND OF THE INVENTION

The present invention relates to a high density multilayer circuit board, each of the layers of which is accessible by blind via-holes, and more particularly, the invention relates to a high density multilayer circuit board prepared by a photo via-hole forming process, using an incombustible aqueous developing solution, and a photosensitive epoxy resin composition having a preferable resolution, plating solution resistance and heat resistance.

Various photosensitive epoxy resin compositions are well known widely such as the ones disclosed in JP-B-49-17040 (1974), JP-A-50-158694 (1975), JP-A56-55420 (1981), JP-A-63-71840 (1988), and others.

Most of the photosensitive epoxy resin compositions require organic solvents for their development. Chlorine group organic solvents cause many problems, such as water pollution, and therefore, an organic solvent for general use must be used at present. However, the use of an organic solvent inherently has the danger of producing a fire and explosion.

In accordance with the method disclosed in JP-A-63-71840 (1988), development with an alkaline aqueous solution is possible by using polyphenol resin as a base polymer. However, when the photosensitive layer contains so many hydroxyl groups as to be dissolved by the alkaline aqueous solution, the prepared relief pattern is caused to swell or become deformed in a chemical plating solution, which is a kind of alkaline aqueous solution, or there is a possibility that the plating solution will become contaminated by dissolving polyphenol into the plating solution.

On the other hand, the mounting of parts on the surface of a printed circuit board by a solder-reflow process has been used widely in order to mount the parts with a high density. Therefore, a thermally stable thermosetting resin, such as an epoxy resin and the like, has been used as the material of the substrate.

SUMMARY OF THE INVENTION

One of the objects of the present invention is to provide a thermally stable high density multilayer circuit board.

Another one of the objects of the present invention is to provide an epoxy group photosensitive resin composition, which is adequate for forming insulating films among the layers of the multilayer circuit board, which is capable of being developed with an incombustible aqueous developing solution, and which is capable of being plated without swelling or being dissolved into the chemical developing solution, which is an alkaline aqueous solution.

The present invention provides a multilayer circuit board, each of the layers of which is accessible via blind via-holes having a resolution of 25~80 μm, and an aspect ratio of 2.0 ~0.6, and particularly, the glass transition temperature of the insulating layers having the via-holes, which insulate the layers of the multilayer circuit board from each other, is in the range of 150~220° C.

The above mentioned insulating layers having the via-holes, which insulate the layers of the multilayer circuit board, can be formed, for example, by curing a photosensitive resin composition, and the insulating layers can be formed, for example, by laminating two kinds of photosensitive resin composition having different transmission characteristics for near ultraviolet light with respect to each other.

Furthermore, the present invention provides a photosensitive resin composition containing (a): 60~90 parts by weight of polyfunctional epoxy resin, (b): 10~40 parts by weight of resin having a phenolic hydroxyl group, (c): 3~30 parts by weight of a photo-acid generating agent to 100 parts by weight of the sum of (a) and (b), and (d): 1~5 parts by weight of a release agent to 100 parts by weight of the sum of (a) and (b). The photosensitive resin composition was used to prepare a photosensitive layer 1, which will be mentioned later.

As the above component (a), a mixture of (a1) 10~50 parts by weight of bifunctional epoxy resin having an epoxy equivalent of 130~300 g/eq, and (a2) 80~10 parts by weight of at least trifunctional epoxy resin having an epoxy equivalent of 160–300 g/eq can be used. As the above compound (a1), at least one resin selected from a group consisting of bisphenol type epoxy resin, aliphatic epoxy resin, and alicyclic epoxy resin, and, as the above compound (a2), a novolak type epoxy resin or its substituted resin can be used.

As the above component (b), at least one resin selected from a group consisting of novolak resin, resole resin, hydroxystyrene polymer or its copolymer, hydroxyphenyl maleimide polymer or its copolymer, and a self condensation type resin having a phenolic hydroxyl group can be used.

As the above component (d) of the release agent, at least one hydrophobic oil selected from a group consisting of polysiloxane, polyether, or its copolymer can be used.

Furthermore, the present invention provides a photosensitive resin composition containing, in addition to the above components (a)~(d), (e): 3~100 parts by weight of hydroxide, oxides, and carbonates of IIa group, IIIa group, and IVa group elements to 100 parts by weight of the sum of (a) and (b), (f): 3~30 parts by weight of a rubber component to 100 parts by weight of the sum of (a) and (b), and (g): 0.1~10 parts by weight of a thermal curing agent to 100 parts by weight of the sum of (a) and (b). The photosensitive resin composition is used to prepare a photosensitive layer 2, which will be mentioned later.

As the above component (e), at least one inorganic compound selected from a group consisting of calcium carbonate, magnesium hydroxide, aluminum hydroxide, and silicon oxide can be used. As the above component (f) of the rubber component, a rubber component containing fine particles of rubber can be used. As the above component (g), an onium salt can be used.

In the processes of BGA (Ball Grid Array) and bare chip mounting, which are receiving attention in the field of high density surface mounting, the multilayer circuit board is required to have a treat resistance, because the multilayer circuit board itself is treated as a mounted body in the process of mounting, such as reflowing, gold wire bonding, and others. Various characteristics, such as an adhesive force with a conducting wire at a high temperature, an elastic modulus at a high temperature, a thermal expansion coefficient, and others are required. However, the above characteristics are generally decreased in the temperature region higher than the glass transition temperature. Accordingly, in order to prevent the characteristics from decreasing at the high temperature which occurs in the mounting process and in a repairing process, the glass transition temperature must be raised to as high a level as possible. It was found that, if the insulating film between the layers having the blind via-holes was formed with an epoxy resin composition having a glass transition temperature after curing of 150~220° C., any defects of the multilayer circuit board were hardly generated at the time of mounting and repairing. The glass transition temperature can be regarded as an index indicating a degree of cross linkage density of the resin. Therefore, if the cross linkage of the resin exceeds a definite value, the decreasing rate of the characteristics of the circuit board at a high temperature is assumed to be restricted to a small value. That means that, if the glass transition temperature is lower than 150° C., the insulating film (photosensitive layer) between the layers is softened significantly by the heating during the mounting process. Therefore, when a component, such as in a LSI, is mounted at the wiring pad on the photosensitive layer with gold wire bonding, the photosensitive layer is deformed by the pressure of the bonding, and a defect in the insulation can result. On the contrary, if the glass transition temperature is higher than 220° C., no problems are generated in a mechanical strength and the like. However, in order to raise the glass transition temperature to higher than 220° C., a multifunctional epoxy resin having a rigid molecular structure must be used mainly. Therefore, the solubility of the resin into the developing solution is decreased, and fine manufacturing becomes difficult.

Various methods for forming the blind via-holes in the insulating film between the layers, such as mechanical drilling and laser manufacturing, can be used. However, a photo via-hole forming process using a photosensitive resin composition is preferable in view of productivity, because many blind via-holes can be formed simultaneously.

The blind via-holes can be manufactured by a drilling process using a laser. However, because of the narrow area of exposure of the laser, it takes remarkably long time for manufacturing all of the via-holes of the substrate, so that practical use of a laser drilling process is difficult. On the contrary, the drilling process using a photosensitive resin composition can provide a wide exposing area, and hence, the manufacturing time is fast. Furthermore, the apparatus for the drilling process using a photosensitive resin composition has the advantages that it is simpler and safer than the apparatus used for the laser drilling process.

The insulating film between the layers is not necessarily a single layer, but at least two kinds of epoxy group insulating films between the layers, having different transmission characteristics for near ultraviolet light with respect to each other, can be used by laminating the films as a laminated layer. The properties of high resolution and high adhesive force can be made compatible by laminating a photosensitive layer 1 having a preferable transmission for the near ultraviolet light and a superior resolution, and a photosensitive layer 2 containing a roughening component, such as an inorganic filler, rubber particles, and the like, of which the adhesive force with the plated wire is preferable, although its transmission for the near ultraviolet light is not desirable, as indicated in FIG. 1 (A). In the above case, the photosensitive resin composition must be applied twice in order to form an insulating film between the layers. On the contrary, in accordance with a method which forms only a single layer, wherein fine circuits 7, such as extension around of the wire is necessary, with the transparent photosensitive layer 1, and another layer with the photosensitive layer 2 having a preferable adhesive force, as indicated in FIG. 1(B), each of the insulating films between the layers can be formed in a single application, and so the properties of high densification of the conductor wiring and the high adhesive force can be made compatible. However, in either of the above cases, the important point is to laminate the films and layers so that the insulating film between the layers under the conductor wiring formed by plating will contain a roughening agent, such as an inorganic filler, rubber particles, and the like.

A photosensitive resin composition which is adequate for use with the present invention will be explained hereinafter. In the following explanation, the insulating film between the layers having the blind via-holes will simply be referred to as a "photosensitive layer".

As a resin composition having a preferable transmission for near ultraviolet light, a photosensitive resin composition containing the following components is usable:

(a): 60~90 parts by weight of polyfunctional epoxy resin,
(b): 10~40 parts by weight of a resin having a phenolic hydroxyl group,
(c): 3~30 parts by weight of a photo-acid generating agent to 100 parts by weight of the sum of (a) and (b), and
(d): 1~5 parts by weight of a release agent to 100 parts by weight of the sum of (a) and (b).

When the content of the polyfunctional epoxy resin is less than 60 parts by weight, the glass transition temperature (Tg) is lowered, and if it is larger than 90 parts by weight, the resolution is decreased.

When the content of the phenolic hydroxyl group is equal to or less than 10 parts by weight, the developing performance is deteriorated, and the resistance against a chemical plating solution is decreased at 40 parts by weight.

When the content of the photo-acid generating agent is less than 3 parts by weight, the photo-curing becomes insufficient, the resistance against the chemical plating solution is decreased, and Tg is lowered. If the content exceeds 30 parts by weight, transmission of light by the photosensitive layer is decreased, and the thickness of the cured film can be thin.

When the content of the release agent is less than 1 part by weight, a sufficient releasing effect can not be obtained, and if the content exceeds 5 parts by weight, a defect can be generated by the coagulating of the release agent in the photosensitive layer.

The polyfunctional epoxy resin is a component, which causes-a cross linkage reaction by the effect of the acid generated from the photo-acid generating agent with exposure, and forms a latent image therein. The polyfunctional epoxy resin used as the (a) component does not have any particular restriction, but a desirable example is a mixture of (a1) 10~50 parts by weight of bifunctional epoxy resin having an epoxy equivalent of 130~300 g/eq, and (a2) 80~10 parts by weight of at least a trifunctional epoxy resin having an epoxy equivalent of 160~300 g/eq. An epoxy resin with the addition of with bromine can be used concurrently as a flame retarder.

The bifunctional epoxy resin of the above component (a1) contributes to decreasing the varnish viscosity of the photosensitive resin composition, flattening the photosensitive resin varnish when covering the internal wiring, providing flexibility to the photosensitive layer after drying to prevent the layer from generating cracks, and providing an adhesive force between the substrate and the conductor wiring after curing the photosensitive layer. When the mixing ratio of the bifunctional epoxy resin of the above component (a1) is less than 10 parts by weight, the dried photosensitive layer becomes brittle, and the resolution is decreased. When the content exceeds 50 parts by weight, a tack-free property is degraded and the Tg can be decreased.

Practical examples of the bifunctional epoxy resin are as follows:

Various bisphenol A epoxy resin, bisphenol F epoxy resin, aliphatic epoxy resin, and alicyclic epoxy resin such as Epicoat 801, 802, 807, 815, 819, 825, 827, 828, and 834 made by Yuka shell Co., Nadecoal EX-201, 212, 821, made by Nagase Chemical Industries Co., and KRM 2110, 2410, and the like made by Asahi Denka Industries Co.

The at least trifunctional epoxy resin of the above component (a2) contributes to an increase in the density of the cross linkage of the photosensitive layer for elevating the glass transition temperature. When the mixing ratio of the at least trifunctional epoxy resin exceeds 80 parts by weight, the dried photosensitive layer becomes brittle, and the resolution is decreased. When the content is less than 10 parts by weight, a tack-free property is degraded and the Tg can be decreased.

Examples of the at least trifunctional epoxy resin are desirably a polyfunctional epoxy resin, such as phenolic novolak epoxy resin, orthocresol novolak epoxy resin, and the like. Practically, Epicoat 18S65 and 1031S made by Yuka shell Co., ESCN195 and 220 made by Sumitomo Chemicals Co., BREN-104, 105, EOCN-104S, EPPN-201, 501 made by Nihon Kayaku Co., and KRM 2650, and the like made by Asahi Denka Industries Co., are used.

The resin having a phenolic hydroxyl group of the above component (b) contributes to an increasing of the solubility into the aqueous developing solution in the developing operation, and an increasing of the density of the cross linkage of the photosensitive layer for elevating the glass transition temperature by reacting with the epoxy resin at the curing time. Examples of the resin having a phenolic hydroxyl group are novolak epoxy resin, polyhydroxystyrene, polyhydroxyphenyl maleimide, and the like. Particularly desirable examples are various revel resins having a phenolic hydroxyl group and a methyrol group in a molecule. Because the revel resin causes a self condensation reaction with an acidic catalyst, the density of the cross linkage of the photosensitive layer is increased more than other phenolic resins to provide a cured film having a higher Tg, and the amount of phenolic hydroxyl group which remains in the cured film is decreased to improve the resistance against the plating solution.

The photo-acid generating agent of the component (c) is a component for generating an acid which is used as a curing agent for the epoxy resin at the time of exposure of light. Examples of the photo-acid generating agent are various onium salts such as triallylsulfonium salt, diallyliodonium salt, and the like, which contain BF4, PF6, AsF6, and SbF6 as a pairing anion. All the photo-acid generating agents are obtainable commercially.

The release agent of the component (d) is exuded to the surface of the photosensitive layer at the time of drying and curing the photosensitive layer for covering the surface of the photosensitive layer. By covering the surface of the photosensitive layer, the release agent improves the tack-free property of the photosensitive layer, and improves the developing property by preventing bleeding of the developing solution from the exposed and cured portion. Examples of the release agent are polysiloxane, polyether, or their copolymers. Practically, perenol F40, and perenol S43 made by San-nopro Co., SC5570 made by Toray-Dow Corning Silicone Co., and TSA750 made by Toshiba Silicone Co., are usable.

The inorganic filler of the above component (e) improves the tack-free property of the photosensitive layer and the surface roughening efficiency of the plated surface of the photosensitive layer. Examples of the inorganic filler are hydroxide, oxides, and carbonates of IIa group, IIIa group, and IVa group elements such as calcium carbonate, magnesium hydroxide, aluminum hydroxide, and silicon oxide. The particle sizes of the inorganic filler are desirably smaller than each of the thickness of the photosensitive layer and the diameter of the via-hole. All of the inorganic fillers are obtainable commercially.

The rubber component of the above component (f) provides flexibility to the photosensitive layer to prevent the photosensitive layer from generating cracks, and enhances the adhesive force between the photosensitive layer and the conductor wiring. In order to prevent the photosensitive layer after curing from decreasing the Tg, concurrently adding fine particles of rubber with the component (f) is desirable. The diameter of the fine particles of rubber is desirably smaller than the thickness of each photosensitive layer and the diameter of the via-hole. Examples of the fine particles of rubber are XER91P made by Nihon Synthetic Rubber Co., YR-528, YR-516, wherein the rubber particles are dispersed into the epoxy resin, made by Toto Chemicals Co., and the like.

The thermal curing agent of the above component (g) causes the epoxy group, which remains after the photo-curing reaction, to react by heating. In accordance with the above effect of the thermal curing agent, the density of the cross linkage of the photosensitive layer is increased so as to be larger than the density obtained in the case when only the photo-acid generating agent is used for the curing, and the Tg of the photosensitive layer is raised. Examples of the thermal curing agent are various thermosetting catalysts for an epoxy resin such as triphenylphosphine, imidazole, and the like. Particularly, a preferable example is a thermosensitive onium salt which generates an acid by heating. The above thermal curing agents are obtainable commercially, and, for instance, cure-sol 2E4MZ made by Shikoku Chemical Co., CP-66 made by Asahi Denka Co., and the like are usable.

The photosensitive resin composition mentioned above satisfies the heat resistance, the resistance against the plating solution, and the developing property with an aqueous developing solution, as long as the mixing ratio of each of the components is not unbalanced extremely. The desirable range of each of the components is as follows:

component (a): 60~90 parts by weight,
component (b): 10~40 parts by weight,
component (c): 3~30 parts by weight, and
component (d): 1~5 parts by weight.

When the component (a) is a mixture of (a1) and (a2), 10~50 parts by weight of the (a1) and 80~10 parts by weight of the (a2) are mixed so that total weight of the component (a) becomes 60~90 parts by weight. If the balance among the components (a), (b), and (c) is not maintained adequately, problems will be generated with respect to any of the heat resistance, the resistance against the plating solution, and the developing property. If the component (d) is too small, the tack-free property is decreased and sometimes the contact exposure becomes difficult, and if the component (d) is too much, defects are generated by coagulation of the release agent in the photosensitive layer, and the film forming property is decreased. If the mixing ratio of the components (a1) and (a2) becomes too unbalanced, the tack-free property is degraded and the crack resistance can be decreased.

The photosensitive resin composition having an enhanced adhesiveness with the conductor wiring can be obtained by adding an appropriate amount of the following components (e)~(g), in addition to the above components (a)~(d):

component (e): 3~100 parts by weight,
component (f): 3~30 parts by weight, and
component (g): 0.1~10 parts by weight,
when the total amount of the components (a) and (b) is taken as 100 parts by weight.

The above composition is used to prepare a photosensitive resin composition layer having a high adhesive force with the plated wiring, although the transmission for the near ultraviolet light is inferior in comparison to the photosensitive layer which does not contain the additive components.

The roughening component of the component (e) enhances the adhesiveness of the photosensitive layer with the conductor wiring prepared by plating. However, when the mixed fraction of the component (e) is less than 3 parts by weight, an increase in the adhesive force, the tack-free property and the dispersing property of the rubber particles can not be observed. On the contrary, when the mixed fraction of the component (e) exceeds 100 parts by weight, the photosensitive layer becomes brittle, and the developing property is decreased.

The rubber component of the component (f) enhances the adhesive force of the photosensitive layer with the interior wiring and the conductor wiring prepared by plating. However, when the mixed fraction of the component (f) is less than 3 parts by weight, an increase in the adhesive force can not be observed, and, when the mixed fraction of the component (e) exceeds 30 parts by weight, the density of the cross linkage is decreased, and accordingly, the developing property and the Tg of the photosensitive layer are decreased.

The thermal curing agent of the component (g) is a thermosetting catalyst provided to increase the Tg of the photosensitive layer by heating after the exposure hardening. fAs the thermal curing agent, triphenylphosphine, 2E4MZ and C11Z made by Shikoku Chemicals Co., and CP-66 made by Asahi Denka Co. can be used. When triphenylphosphine group compounds and imidazole group compounds are used as the thermal curing agent, the additive amount of the agent is desirably equal to or less than 1 part by weight, because, if more than 1 part by weight of the compound is added, the photocuring reaction can be disturbed. When onium salt group compounds are used as the thermal curing agent, if the additive amount of the agent exceeds 10 parts by weight, the photosensitive layer after the curing tends to become brittle, although the photocuring reaction is not disturbed, and the storage stability is decreased. The kind and the additive amount of the thermal curing agent can be adjusted in consideration of the characteristics, such as the Tg, the elastic modulus, and others which are required for the photosensitive layer after the curing.

As the aqueous developing solution for the photosensitive resin composition mentioned above, an aqueous solution of a water soluble organic solvent having a high boiling point, or an aqueous solution, wherein an alkaline component is added, of an organic solvent having a high boiling point can be used. As the water soluble organic solvent, 2-butoxyethanol, 2,2'-butoxyethoxyethanol, and the like are desirably used. As the above alkaline component, sodium hydroxide, potassium hydroxide, tetramethylammonium hydroxide, and the like can be used. The concentration of the wafer soluble organic solvent is approximately in the range of 10~50% by weight, by which the solution is maintained inflammable, and the concentration of the alkaline component is desirably in the range of approximately 1~20% by weight.

The photosensitive resin composition of the present invention can be stored and used as a varnish of a general organic solvent, such as methylethylketone, toluene, xylene, methyl cellosolve, butyl cellosolve, carbitol, butylcarbitol, ethylacetate, butylacetate, cellosolve acetate, tetrahydrofuran, and the like. The desirable solid concentration is in the range of 30~80% by weight. The photosensitive layer of approximately 20~100 µm thick is obtained after drying by a single application of the above varnish, when the varnish is applied onto the substrate.

An example of the process of preparing the multilayer 5 circuit board using the photosensitive resin composition of the present invention will be explained hereinafter with reference to FIGS. 2A to 2C, which are schematic cross sections of the board, showing various steps of the process:

Step (A): The surface of the substrate 4 having an internal wiring 3 is covered with a highly adhesive photosensitive layer 2 containing a rubber component, an inorganic filler and a thermal curing agent.

Step (B): The board obtained by the step (A) is exposed to light via a via-hole mask (not shown in the drawing), and the via-holes 5 are formed by dissolving to remove the unexposed portion with a developing solution, and heating.

Step (C): Subsequently, the surface of the photosensitive layer 2 and the inside of the via-holes are roughened, and the plating catalyst 6 is added and activated thereon.

Step (D): The surface of the photosensitive layer 2 is coated with a photosensitive layer 1, which does not contain an inorganic filler, the rubber particles, and the others, having a high resolution, and then, the photosensitive layer 1 is exposed to light via a via-hole mask (not shown in the drawing) and developed. After predetermined heating is performed, the conductor wiring of the fine wiring 7 is formed inside the via-holes 5 and in the second layer by chemical plating. After forming the conductor wiring, a post-curing is performed.

Either a copper clad laminate manufactured by etching, or a substrate whereon wiring is formed by an additive method can be used as the substrate for the inner layer, which is the starting material of the present invention. When the conductor wiring is made of copper, the adhesiveness between the conductor wiring and the photosensitive layer can be increased by conventional methods for roughening of the copper surface, forming an oxide film, reducing the oxide film, nickel plating, and others.

The photosensitive resin varnish can be applied by conventional methods such as dip-coating, curtain-coating, roll-coating, knife coating, screen-printing, and the like. The applied varnish is dried at a temperature at which the epoxy resin is not cured, that is in the range of 80~120° C., for making the film tack-free.

The inside of via-holes and the surface of the photosensitive layer can be roughened by a chromic acid mixture or a permanganic acid aqueous solution.

After the roughening, neutralization, elimination of roughening residue, and the addition and activation of the plating catalyst are performed, the conductor wiring in the via-holes and the conductor wiring in the layers after the second layer are formed by a conventional additive method using chemical plating, or concurrently using chemical plating and electroplating, and an etching method. If the curing by heating after the development is insufficient, the photosensitive layer can be heated after forming the conductor wiring at higher than 160° C. in order to enhance the curing.

In accordance with the present invention, a photosensitive 5 resin composition which is superior in its developing property, its heat resistance after curing, and its resistance against the plating solution was provided by mixing the epoxy resin for general use and the resin having a phenolic hydroxyl group with a predetermined ratio, and the tack-free property was improved by adding an oily release agent without lowering the resolution. Accordingly, a contact exposure became possible, and a fine wiring pattern became to be prepared readily. Furthermore, the adhesive force with the conductor wiring and the glass transition temperature of the photosensitive resin composition can be increased by adding the rubber component, the inorganic filler, and the thermal curing agent to the photosensitive resin composition.

A feature of the multilayer circuit board prepared from the photosensitive resin composition will be explained hereinafter with reference to FIG. 2.

The photosensitive layer 2 containing the rubber component, the inorganic filler, and the thermal curing agent has a high adhesive force with the interior wiring, because the modulus of elasticity of the photosensitive layer 2 is decreased by the effect of the rubber component. Furthermore, the photosensitive layer 2 also has a high adhesive force with the conductor wiring formed by plating, because the surface roughening efficiency of the photosensitive layer 2 is increased by the effect of the inorganic filler. On the contrary, the photosensitive layer 1, which does not contain the rubber component and the inorganic filler, has a high resolution, and it makes fine manufacturing possible, because no component, which scatters and absorbs light when it is exposed to the light, is contained in the photosensitive layer 1. In accordance with the multilayer circuit board of the present invention, the photosensitive layer 2 having a high adhesive force with the conductor wiring fixes the conductor wiring in the multilayer circuit board, and so a photosensitive layer 1 having a high resolution having fine wiring is obtained. Therefore, a high density circuit board, wherein the conductor wiring does not break away due to thermal stress generated in the solder-reflowing process, repairing process, and the other related process, can be prepared by laminating alternately the two kinds of photosensitive layers.

DESCRIPTION OF THE PREFERRED EMBODIMENTS

Figure 1A:
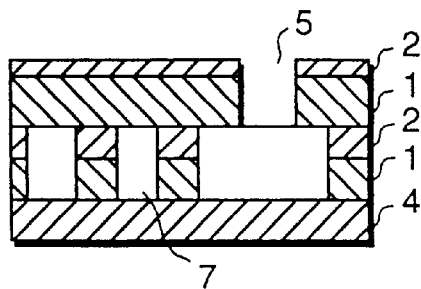
FIG. 1(A) and FIG. 1(B) are schematic cross sections of the multilayer circuit board of the present invention and FIG. 2(A), FIG. 2(B), FIG. 2(C), and FIG. 2(D) are schematic cross sections of the multilayer circuit board of the present invention indicating examples of the manufacturing steps (A), (B), (C), and (D).
Figure 1B:
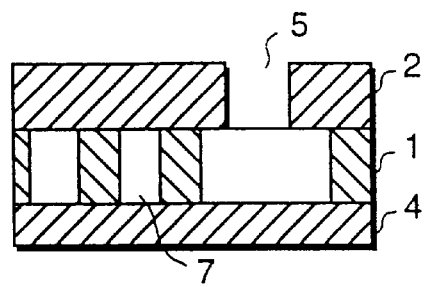
Figure 2A:
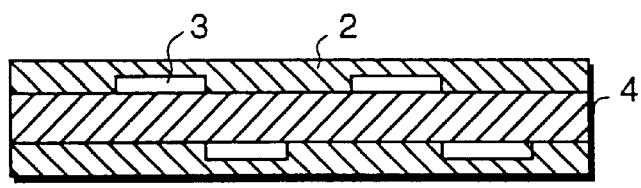
Figure 2B:
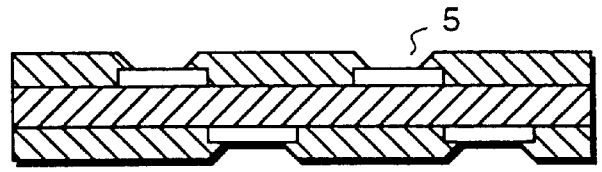
Figure 2C:
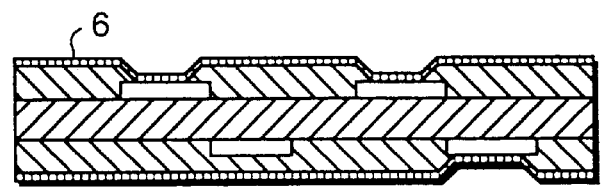
Figure 2D:
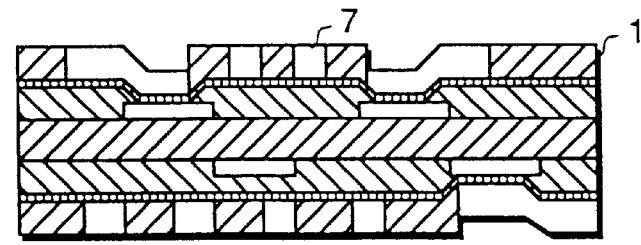

The components and methods for evaluation used in the following embodiments are as follows:

Components (a1) Ep-828: Bisphenol A epoxy resin (189 g/eq) made by Yuka Shell Co.

Ep-807: Bisphenol F epoxy resin (168 g/eq) made by Yuka Shell Co.

Components (a2)

ESCN-195: Cresol-novolak epoxy resin (198 g/eq) made by Sumitomo Chemicals Co.

BREN-105: Bromized novolak epoxy resin (270 g/eq) made by Nihon Kayaku Co.

KRM-2650: Cresol-novolak epoxy resin (220 g/eq) made by Asahi Denka Co.

Component (b)

HP-180R: Resol resin made by Hitachi Chemicals Co.

Component (c)

UV1-6974: Triphenylsulfonium hexafluoroantimonate (a photo-acid generating agent) made by Union Carbide Co.

Component (d) Perenol S43: Polysiloxane copolymer (release agent) made by San Nopuko Co.

Component (e)

Silicon oxide: an average diameter 1 µm.

Component (f)

XER91P: (fine particles of rubber) made by Nihon Synthetic Rubber Co.

YR-528: (20 parts by weight, Ep 828 containing fine particles of rubber) made by Toto Chemicals Co.

The above YR-528 is a mixture of 80 parts of the component (a1) and 20 parts of the component (f).

DT-8208: Epoxy modified rubber made by Toto Industries Co.

Component (g) CP-66: thermosensitive onium salt (thermal curing agent) made by Asahi Denka Co.

The Method for Evaluation:

(1) Evaluation of the Resolution (developing property)

The photosensitive resin varnish was applied onto a copper surface of a metallic foil having a laminated double layer structure of aluminum and copper (made by Mitsui Metals Co. UTC foil 50 µm thick) with a bar coater, and it was dried at room temperature for one hour at 120° C. for 15 minutes to prepare a test piece having a photosensitive layer approximately 50µm thick.

The test piece was exposed to white light from an extra-high pressure mercury lamp by 3 J/cm$^2$ through a via-hole mask 10~160 µm in diameter. Subsequently, the test piece was heated at 120 C. for 15 minutes for enhancing the curing. Then, the test piece was developed by a spray method with the following developing solution, and a developable diameter of the via-hole was taken as the resolution.

Composition of the Developing Solution:

2,2'-butoxyethoxyethanol: 10 g

15% tetramethylammonium hydroxide aqueous solution: 10 g purified water: 20 g (2) Evaluation of Tack-free Property If the photosensitive layer was adhered to the via-hole mask when stripping the via-hole mask from the test piece after the exposure of light, the test piece was determined as having a deficient tack-free property, and is marked X in Table 1. The test piece determined as having a good tack-free property was marked with an 0 in Table 1.

(3) Determination of the Film Thickness

The test piece after development was cured at 180° C. for 2 hours. Then, the aluminum layer of the test piece was etched with an aqueous solution of sodium hydroxide (100 g/l) and washed with water, and the copper layer was etched with an etchant composed of sulfuric acid (100 g/l) and a 35% hydrogen peroxide aqueous solution (200 g/l) to obtain the cured film after the curing. The thickness of the obtained cured film was measured.

(4) Determination of the Glass Transition Temperature

A portion, which did not have any holes, of the cured film used for determining the film thickness was cut out to obtain a piece 30 mm long and 5 mm wide as a test piece. The glass transition temperature was determined using an apparatus DVA-200 made by IT Measurement and Control Co. by measuring the dynamic viscoelasticity of the test piece. The measuring conditions were as follows:

span of supports: 20 mm measuring frequency: 10 Hz temperature elevation velocity: 5° C./minute temperature range: room temp.~300° C.

(5) Adhesiveness with the Internal Wiring

The surface of a copper foil 20 μm thick was roughened with an aqueous solution of ammonium persulfate, an oxide film was formed thereon with an aqueous solution containing sodium perchlorate as a main component, a reducing treatment of the film was performed with an aqueous solution of dimethylamine borane, and the foil was dried. After applying varnish, drying it, and exposing the whole surface of the foil to light in the same manner as the method described in the previous item (1), the varnish was cured by heating at 180° C. for 2 hours. An epoxy adhesive agent (Araldite made by Nagase-Chiba Co.) was applied onto the surface of the exposed layer, and adhered to a grass epoxy substrate. The peel strength of the copper foil was measured by the method defined by JISC5481.

(6) Adhesiveness with the Plated Wiring

A copper clad laminate having a copper foil 18 μm thick was treated in the same manner as the method described in the previous item (5), and an exposed layer was prepared by applying and exposing processes. After enhancing the curing by heating at 140~160° C. for 30 minutes, the surface of the laminate was roughened with an aqueous solution of permanganic acid. Subsequently, the surface was neutralized, added with the plating catalyst, and activated. A panel plating approximately 20 μm thick was performed with a concurrent use of chemical plating and electric plating, and the plated laminate was dried at 180° C. for 2 hours. The peel strength of the plated copper layer was measured by the method defined by JISC5481.

(Embodiment 1)

A varnish having a solid concentration of 60% by weight was prepared by dissolving and dispersing Ep-828 (component (a1)): 33.3 parts by weight, ESCN-195 (component (a2)): 33.3 parts by weight, HP-180R (component (b)): 33.3 parts by weight, UVI-6974 (component (c)): 3.3 parts by weight, and Perenosal S43 (component (d)): 3.3 parts by weight into 1-acetoxy-2-ethoxyethane.

(Embodiment 2)

A varnish having a solid concentration of 60% by weight was prepared by dissolving and dispersing Ep-807 (component (a1)): 33.3 parts by weight, ESCN-195 (component (a2)): 33.3 parts by weight, HP-180R (component (b)): 33.3 parts by weight, UVI-6974 (component (c)): 3.3 parts by weight, and Perenosal S43 (component (d)): 3.3 parts by weight into 1-acetoxy-2-ethoxyethane.

(Embodiment 3)

A varnish having a solid concentration of 60% by weight was prepared by dissolving and dispersing Ep-828 (component (a1)): 33.3 parts by weight, BREN-105 (component (a2)): 33.3 parts by weight, HP-180R (component (b)): 33.3 parts by weight, UVI-6974 (component (c)): 3.3 parts by weight, and Perenosal S43 (component (d)): 3.3 parts by weight into 1-acetoxy-2-ethoxyethane.

(Embodiment 4)

A varnish having a solid concentration of 60% by weight was prepared by dissolving and dispersing Ep-828 (component (a1)): 33.3 parts by weight, ESCN-195 (component (a2)): 33.3 parts by weight, HP-180R (component (b)): 33.3 parts by weight, UVI-6974 (component (c)): 3.3 parts by weight, Perenosal S43 (component (d)): 3 parts by weight, Silicon oxide (component (e)): 10 parts by weight, and XER91P (component (f)): 10 parts by weight into 1-acetoxy-2-ethoxyethane.

(Embodiment 5)

A varnish having a solid concentration of 60% by weight was prepared by dissolving and dispersing Ep-828 (component (a1)): 33.3 parts by weight, ESCN-195 (component (a2)): 33.3 parts by weight, HP-180R (component (b)): 33.3 parts by weight, UVI-6974 (component (c)): 3.3 parts by weight, Perenosal S43 (component (d)): 3 parts by weight, Silicon oxide (component (e)): 20 parts by weight, DT-8208 (component (f)): 10 parts by weight, and XER91P (component (f)): 10 parts by weight into 1-acetoxy-2-ethoxyethane.

(Embodiment 6)

A varnish having a solid concentration of 60% by weight was prepared by dissolving and dispersing KRM-2650 (component (a2)): 45 parts by weight, HP-180R (component (b)): 10 parts by weight, UVI-6974 (component (c)): 3.3 parts by weight, Perenosal S43 (component (d)): 3 parts by weight, Silicon oxide (component (e)): 20 parts by weight, DT-8208 (component (f)): 10 parts by weight, and YR-528 (component (a1), (f)): 45 parts by weight into 1-acetoxy-2-ethoxyethane.

(Embodiment 7)

A varnish having a solid concentration of 60% by weight was prepared by dissolving and dispersing KRM-2650 (component (a2)): 45 parts by weight, HP-180R (component (b)): 3.3 parts by weight, Perenosal S43 (component (d)): 3 parts by weight, Silicon oxide (component (e)): 20 parts by weight, DT-8208 (component (f)): 10 parts by weight, YR-528 (component (a1), (f)): 45 parts by weight, and CP-66 (component (g)): 1 part by weight into 1-acetoxy-2-ethoxyethane.

(Embodiment 8)

A varnish having a solid concentration of 60% by weight was prepared by dissolving and dispersing KRM-2650 (component (a2)): 45 parts by weight, HP-180R (component (b)): 10 parts by weight, UVI-6974 (component (c)): 3.3 parts by weight, Perenosal S43 (component (d)): 3 parts by weight, Silicon oxide (component (e)): 20 parts by weight, DT-8208 (component (f)): 10 parts by weight, YR-528 (component (a1), (f)): 45 parts by weight, and CP-66 (component (g)): 3.3 parts by weight into 1-acetoxy-2-ethoxyethane.

(Embodiment 9)

A varnish having a solid concentration of 60% by weight was prepared by dissolving and dispersing KRM-2650 (component (a2)): 45 parts by weight, HP-180R (component (b)): 10 parts by weight, UVI-6974 (component (c)): 3.3 parts by weight, Perenosal S43 (component (d)): 3 parts by weight, Silicon oxide (component (e)): 20 parts by weight, DT-8208 (component (f)): 10 parts by weight, YR-528 (component (a1), (f)): 45 parts by weight, and CP-66 (component (g)): 10 parts by weight into 1-acetoxy-2-ethoxyethane.

Comparative Example 1

A varnish having a solid concentration of 60% by weight was prepared by dissolving and dispersing Ep-828 (component (a1)): 33.3 parts by weight, ESCN-195 (component (a2)): 33.3 parts by weight, HP-180R (component (b)): 33.3 parts by weight, UVI-6974 (component (c)): 3.3 parts by weight, and Perenosal S43 (component (d)): zero (0) parts by weight into 1-acetoxy-2-ethoxyethane.

This comparative example is an example of a photosensitive resin composition which does not contain the release agent (Perenosal S43).

Comparative Example 2

A varnish having a solid concentration of 60% by weight was prepared by dissolving and dispersing Ep-828 (component (a1)):33.3 parts by weight, ESCN-195 (component (a2)): 33.3 parts by weight, HP-180R (component (b)): 33.3 parts by weight, WI-6974 (component (c)): 3.3 parts by weight, and Perenosal S43 (component (d)): 10 parts by weight into 1-acetoxy-2-ethoxyethane.

This comparative example is an example of a photosensitive resin composition, wherein the release agent (Perenosal S43) was added excessively.

Comparative Example 3

A varnish having a solid concentration of 60% by weight was prepared by dissolving and dispersing UVI-6974 (component (c)): 3.3 parts by weight, DT-8208 (component (f)): 10 parts by weight, and YR-528 (component (a), (f)): 100 parts by weight in 1-acetoxy-2-ethoxyethane. This comparative example is an example of a photosensitive resin composition which does not contain a resin having a phenolic hydroxyl group (HP-180R), nor the release agent (Perenosal S43).

The mixing ratio of the components and the results of evaluation in the previous embodiments 1~9 and the comparative examples 1~3 are indicated in Table 1.

parative example 3 indicated a low viscosity because HP-180R and KRM 2650 were not employed, and an undesirable tack-free property because the release agent Perenosal S43 was not used. Furthermore, the resolution could not be determined because the photosensitive layer was stuck to the photo-via-mask. The glass transition temperature (Tg) was as low as 80° C. If a photosensitive layer having such a low Tg is laminated, the photosensitive layer is softened by treat to decrease its mechanical strength remarkably. Therefore, the laminated photosensitive layer can not be used for mounting components, such as in a LSI.

All the embodiments 4~9, wherein a rubber component was added, indicated a preferable adhesiveness with the inner wiring and the plated wiring, such as 0.7~1.4 kgf/cm.

(Embodiment 10)

An inner wiring substrate was prepared by etching a glass epoxy substrate having a copper layer 18 μm thick. The surface of the substrate was roughened with an aqueous solution of ammonium persulfate, and an oxide film was formed thereon with an aqueous solution containing sodium perchlorate as a main component. Subsequently, a reducing treatment of the film was performed with an aqueous solution of dimethylamine borane, and the film was dried. Then the varnish of the embodiment 8 was applied thereon by screen printing, and was dried. The thickness of the photosensitive layer was approximately 50 Wm. A predetermined portion was exposed to light (3 J/cm$^2$) via a via-hole mask,

TABLE 1

|  | Embodiments |  |  |  |  |  |  |  |  | Comparative examples |  |  |
| --- | --- | --- | --- | --- | --- | --- | --- | --- | --- | --- | --- | --- |
|  | 1 | 2 | 3 | 4 | 5 | 6 | 7 | 8 | 9 | 1 | 2 | 3 |
| Ep-828 *1) | 33.3 | — | 33.3 | 33.3 | 33.3 | — | — | — | — | 33.3 | 33.3 | — |
| Ep-807 | — | 33.3 | — | — | — | — | — | — | — | — | — | — |
| ESCN-195 | 33.3 | 33.3 | — | 33.3 | 33.3 | — | — | — | — | 33.3 | 33.3 | — |
| BREN-105 | — | — | 33.3 | — | — | — | — | — | — | — | — | — |
| KRM-2650 | — | — | — | — | — | 45 | 45 | 45 | 45 | — | — | — |
| HP-180R | 33.3 | 33.3 | 33.3 | 33.3 | 33.3 | 10 | 10 | 10 | 10 | 33.3 | 33.3 | — |
| UVI-6974 | 3.3 | 3.3 | 3.3 | 3.3 | 3.3 | 3.3 | 3.3 | 3.3 | 3.3 | 3.3 | 3.3 | 3.3 |
| XER91P | — | — | — | 10 | 10 | — | — | — | — | — | — | 100 |
| YR-528 *2) | — | — | — | — | — | 45 | 45 | 45 | 45 | — | — | 10 |
| DT-8208 | — | — | — | — | 10 | 10 | 10 | 10 | 10 | — | — | — |
| CP-66 | — | — | — | — | — | — | 1 | 3.3 | 10 | — | — | — |
| S43 | 3 | 3 | 3 | 3 | 3 | 3 | 3 | 3 | 3 | 0 | 10 | — |
| Silicon oxide | — | — | — | 10 | 20 | 20 | 20 | 20 | 20 | — | — | — |
| Film thickness μm | 52 | 51 | 52 | 55 | 55 | 55 | 55 | 55 | 55 | 52 | — | 50 |
| Tack-free property | ○ | ○ | ○ | ○ | ○ | ○ | ○ | ○ | ○ | X | ○ | X |
| Resolution μm | 25 | 25 | 25 | 50 | 60 | 60 | 60 | 60 | 60 | 25 | 25 | — |
| Tg (° C.) | 215 | 210 | 214 | 209 | 201 | 150 | 205 | 215 | 222 | 215 | — | 80 |
| Ad. *3  I W *4) | 0.7 | 0.7 | 0.6 | 0.9 | 1.0 | 1.4 | 1.2 | 1.2 | 1.2 | 0.7 | 0.7 | — |
| P w *5) | 0.1 | 0.1 | 0.1 | 0.7 | 0.8 | 1.4 | 1.1 | 1.1 | 0.7 | 0.1 | — | — |

*1): Unit of all the components is parts by weight
*2): YR-528 is a mixture of the component (a1) 80 parts by weight and the component (f) 20 parts by weight
*3): Adhesiveness
*4): Inner layer wiring
*5): plated wiring In accordance with the Table 1, the embodiments 1~3, wherein only the release agent Perenosal S43 was added, had a preferable tack-free property, and the resolution was 25 μm.

On the contrary, the comparative example 1, wherein the release agent was not added, indicated an undesirable tack-free property, and a part of the photosensitive layer was stuck to the mask and peeled off. The comparative example 2, wherein the release agent was included at 10 parts by weight, indicated a preferable tack-free property, but a flat film could not be obtained, because repelling occurred when the photosensitive resin composition was applied. The comand was heated at 120° C. for 15 minutes. The photosensitive layer was developed in the same manner as the embodiments 1~9. Then, after heating at 140° C. for 30 minutes, the surface inside the via-hole and the surface of the photosensitive layer was roughened with an aqueous solution of permanganic acid. After the roughening, neutralization, elimination of roughening residue, and addition and activation of the plating catalyst were performed. Then, the photosensitive resin varnish obtained in the embodiment 1 was applied onto the surface of the photosensitive layer by the screen printing method, and was dried. Predetermined portions were exposed to light via a photomask and wirings, having a minimum wiring width of 25 µm, were developed and were treated at 180° C. for 30 minutes. Fine wiring inside the via-hole and in the second layer were formed by chemical plating, and post-curing was performed at 180° C. for 2 hours. The obtained multilayer circuit board was immersed into a reflow soldering tank at 200° C. for 10 minutes and a reflow soldering tank at 288° C. for 1 minute, but no peeling off of the conductor wiring nor splitting off of the photosensitive layers were observed.

In accordance with the present invention, the heat resistant photosensitive resin composition, which is developable with an incombustible aqueous developing solution, was proposed, and the tack-free property was improved without decreasing the resolution. The adhesiveness of the conductor wiring was improved without lowering the Tg. By using the photosensitive resin composition, high density multilayer circuit board superior in heat resistance, having a glass transition temperature at 150~220° C. of the epoxy group inter-layer insulating film, and blind via-holes of 25~80 µm in diameter and 2.0~0.6 in aspect ratio, could be obtained.

What is claimed is:

1. A multilayer circuit board with blind via-holes between layers, the via-holes having a resolution in the range of 25–80 µm and an aspect ratio in the range of 2.0–0.6, for making the layers accessible to each other,
    wherein an insulating layer is provided between said layers, said insulating layer having said blind via-holes, said insulating layer having a glass transition temperature in the range of 150–220° C.,
    wherein said insulating layer is formed by curing a photosensitive resin composition, and
    wherein said photosensitive resin composition contains:
        component (a): 60–90 parts by weight of polyfunctional epoxy resin,
        component (b): 10–40 parts by weight of resin having phenolic hydroxyl groups,
        component (c): 3–30 parts by weight of a photo-acid generating agent to 100 parts of total amount of the component (a) and the component (b), and
        component (d): 1–5 parts by weight of a release agent to 100 parts of total amount of the component (a) and the component (b).

2. A multilayer circuit board as claimed in claim 1, wherein
    said component (a) is a mixture of:
    component (a1): 10–50 parts by weight of bifunctional epoxy resin having an epoxy equivalent of 130–300 g/eg, and
    component (a2): 80–10 parts by weight of at least trifunctional epoxy resin having an epoxy equivalent of 160–300 g/eg.

3. A multilayer circuit board as claimed in claim 2, wherein
    said component (a1) is at least one resin selected from a group consisting of bisphenol epoxy resin, aliphatic epoxy resin, and alicyclic epoxy resin, and
    said component (a2) is any one of novolak epoxy resin and a substitute thereof.

4. A multilayer circuit board as claimed in claim 1, wherein
    said component (b) is at least one resin selected from a group consisting of novolak resin, resol resin, hydroxystyrene (co-)polymer and hydroxyphenylmaleimide (co-)polymer.

5. A multilayer circuit board as claimed in claim 1, wherein
    said component (b) is resin having a self-condensation phenolic hydroxyl group.

6. A multilayer circuit board as claimed in claim 1, wherein
    said component (d) is a hydrophobic oil selected from a group consisting of polysiloxane, polyether and its copolymer.

7. A multilayer circuit board as claimed in claim 1, which further contains:
    component (e): 3–100 parts by weight of any of a hydroxide, an oxide and a carbonate of IIa group, IIIa group and IV group elements,
    component (f): 3–30 parts by weight of a rubber component, and
    component (g): 0.1–10 parts by weight of a thermal curing agent,
    to 100 parts of total amount of the component (a) and the component (b), respectively.

8. A multilayer circuit board as claimed in claim 7, wherein
    said component (e) is at least one inorganic compound selected from a group consisting of calcium carbonate, magnesium hydroxide, aluminum hydroxide and silicon oxide.

9. A multilayer circuit board as claimed in claim 7, wherein
    said component (f) is a rubber component containing fine rubber particles.

10. A multilayer circuit board as claimed in claim 7, wherein
    said component (g) is an onium salt.

11. A multilayer circuit board with blind via-holes between layers, the via-holes having a resolution in the range of 25–80µm and an aspect ratio in the range of 2.0–0.6, for making the layers accessible to each other,
    wherein an insulating layer is provided between said layers, said insulating layer having said blind via-holes, said insulating layer having a glass transition temperature in the range of 150–220° C.,
    wherein said insulating layer is formed by curing a photosensitive resin composition, and
    wherein said photosensitive resin composition consists essentially of:
        component (a): 60–90 parts by weight of polyfunctional epoxy resin,
        component (b): 10–40 parts by weight of resin having phenolic hydroxyl groups,
        component (c): 3–30 parts by weight of a photo-acid generating agent to 100 parts of total amount of the component (a) and the component (b),
        and component (d): 1–5 parts by weight of a release agent to 100 parts of total amount of the component (a) and the component (b).

* * * * *